United States Patent
Zhu et al.

(10) Patent No.: US 12,156,353 B1
(45) Date of Patent: Nov. 26, 2024

(54) SERVER CASE LATCH STRUCTURE AND SERVER

(71) Applicant: SUZHOU METABRAIN INTELLIGENT TECHNOLOGY CO., LTD., Jiangsu (CN)

(72) Inventors: Jingxian Zhu, Jiangsu (CN); Xiuzhong Yin, Jiangsu (CN); Zhencai Cao, Jiangsu (CN); Shanhu Lv, Jiangsu (CN); Zhanyang Li, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/705,401

(22) PCT Filed: Sep. 19, 2022

(86) PCT No.: PCT/CN2022/119681
§ 371 (c)(1),
(2) Date: Apr. 26, 2024

(87) PCT Pub. No.: WO2023/184892
PCT Pub. Date: Oct. 5, 2023

(30) Foreign Application Priority Data

Mar. 31, 2022 (CN) .......................... 202210332652.X

(51) Int. Cl.
*H05K 5/02* (2006.01)
*G06F 1/18* (2006.01)

(52) U.S. Cl.
CPC ........... *H05K 5/0221* (2013.01); *G06F 1/183* (2013.01)

(58) Field of Classification Search
CPC .................................................. H05K 7/1487
See application file for complete search history.

(56) References Cited

U.S. PATENT DOCUMENTS

| | | | |
|---|---|---|---|
| 2015/0189785 A1* | 7/2015 | Zhu | H05K 7/1487 361/679.33 |
| 2016/0255731 A1* | 9/2016 | Ran | A47B 97/001 361/807 |
| 2020/0120819 A1 | 4/2020 | Lee | |

FOREIGN PATENT DOCUMENTS

| | | |
|---|---|---|
| CN | 107765785 A | 3/2018 |
| CN | 110888509 A | 3/2020 |

(Continued)

OTHER PUBLICATIONS

Corresponding International Patent Application No. PCT/CN2022/119681, International Search Report, Date Mailed Jan. 6, 2023.

(Continued)

*Primary Examiner* — Jerry Wu
(74) *Attorney, Agent, or Firm* — Cooper Legal Group, LLC

(57) ABSTRACT

A server case latch structure and a server are disclosed. The structure includes: an upper-layer case including an L-shaped groove; lower-layer case having a locking snapping portion and an unlocking snapping portion; a sliding block having an elastic arm provided with a hook, wherein the hook can be snapped with the locking snapping portion or the unlocking snapping portion in the sliding stroke of the sliding block, and the sliding block has an operation portion; and a stopping member. When the sliding block moves to snap with the locking snapping portion, the stopping member is snapped with the L-shaped groove, so that the upper-layer case and the lower-layer case are locked; and when the sliding block moves to disengage the hook from the locking snapping portion, the stopping member is un-snapped locked from the L-shaped groove, and the upper-layer case and the lower-layer case are unlocked.

20 Claims, 6 Drawing Sheets

(56) References Cited

FOREIGN PATENT DOCUMENTS

| | | |
|---|---|---|
| CN | 111367375 A | 7/2020 |
| CN | 114003098 A | 2/2022 |
| CN | 114489286 A | 5/2022 |

OTHER PUBLICATIONS

Corresponding International Patent Application No. PCT/CN2022/119681, Written Opinion, Date Mailed Jan. 6, 2023.
First Office Action of corresponding CN priority application CN202210332652.X, dated May 23, 2022.
Notification of Grant of corresponding CN priority application CN202210332652.X, dated Jun. 13, 2022.

* cited by examiner

SERVER CASE LATCH STRUCTURE AND SERVER

This application claims priority to Chinese Patent Application No. 202210332652.X, filed on Mar. 31, 2022 in China National Intellectual Property Administration and entitled "Server Case Latch Structure and Server", which is hereby incorporated by reference in its entirety.

FIELD

The present application relates to a technical field of servers, in particular to a server case latch structure. In addition, the present application also relates to a server including the server case latch structure.

BACKGROUND

In an upper-lower layer architecture of a server case, an upper-layer case needs to be fixed after being flipped or mounted vertically toward the case. Traditional fixing methods are mostly for I-nails with locking screws or spring pins. Direct screwing of mounting screws is one of most commonly used fixing methods with a simple structure. However, this fixing method requires tool operation for implementation, leading to a problem of inconvenient operation.

SUMMARY

In an aspect, the present application provides a server case latch structure, including:
  an upper-layer case and a lower-layer case, where the upper-layer case and the lower-layer case can be buckled and can be disengaged, an L-shaped groove is formed on the upper-layer case, and the lower-layer case is provided with a locking snapping portion and an unlocking snapping portion;
  a sliding block, slidably provided at the edge of the lower-layer case, where the sliding block includes an elastic arm that is provided with a hook, the hook can be snapped with the locking snapping portion or the unlocking snapping portion in a sliding stroke of the sliding block, and the sliding block comprises an operation portion capable of being manually shifted; and
  a stopping member, disposed on the sliding block and configured to be snapped with the L-shaped groove so as to limit disengagement of the upper-layer case and the lower-layer case.

When the sliding block moves to snap the hook with the locking snapping portion, the stopping member is snapped with the L-shaped groove, whereby the upper-layer case and the lower-layer case are locked. When the sliding block disengage the hook from the locking snapping portion, the stopping member disengage the hook from the locking snapping portion, and the upper-layer case and the lower-layer case are unlocked.

In some embodiments, the upper-layer case is provided with an upper-layer base protrusion which is recessed relative to the upper-layer case.

In some embodiments, the L-shaped groove is formed on the upper-layer base protrusion.

In some embodiments, the lower-layer case is provided with a sliding block return spring connected to the sliding block, and an elastic force of the sliding block return spring is configured to locate the sliding block at a snap position of the locking snapping portion with the hook.

In some embodiments, a sliding block cover plate is further included. The sliding block cover plate is provided on the lower-layer case and forms a sliding rail of the sliding block with the lower-layer case. The sliding block cover plate is provided with a hand pushing via hole, whereby a hand of an operator stretches into the hand pushing via hole from the outside of the lower-layer case and pushes up the operation portion, and the hook moves from the unlocking snapping portion to the locking snapping portion.

In some embodiments, the sliding block cover plate is fixed to the lower-layer case by rivets or screws, whereby the sliding block cover plate and the lower-layer case form an inner cavity in which the sliding block slides.

In some embodiments, the locking snapping portion and the unlocking snapping portion are disposed on the sliding block cover plate.

In some embodiments, the locking snapping portion and the unlocking snapping portion have groove or notch structures.

In some embodiments, the stopping member is an I-shaped stopping nail, and a middle part of the I-shaped stopping nail is provided with an annular snapping groove.

In some embodiments, the I-shaped stopping nail is snapped and fixed to the sliding block, and the annular snapping groove is facilitate sliding in the L-shaped groove through the annular snapping groove.

In some embodiments, the sliding block is provided with a return spring mounting groove, and the sliding block return spring is provided in the return spring mounting groove.

In some embodiments, the server case latch structure further includes:
  an angle pin fixing seat, disposed on the upper-layer case; and
  an angle pin, slidably disposed in a track of the angle pin fixing seat and connected to the angle pin fixing seat through an angle pin return spring, an elastic force of the angle pin return spring is configured to move the angle pin to a locking position.

When the angle pin moves to the locking position, the angle pin pushes the sliding block to slide to a position where the hook is snapped with the locking snapping portion, and the stopping member is snapped with the L-shaped groove.

When the sliding block moves to a position where the hook is disengaged from the locking snapping portion, the sliding block pushes the angle pin, and the angle pin return spring is forced and deformed.

In some embodiments, the sliding block is provided with a protruding structure configured to be in squeezing fit with the angle pin, the angle pin is provided with a wedge-shaped surface, and the protruding structure is provided with a wedge-shaped end that fits with the wedge-shaped surface.

In some embodiments, the sliding block is provided with a recessed hand clasp position, whereby the sliding block is shifted.

In some embodiments, the angle pin fixing seat is further provided with an angle pin fixing chamber for accommodating the angle pin.

In some embodiments, both sides of the upper-layer case are provided with the angle pin and the angle pin fixing seat, and inner walls of both sides of the lower-layer case are provided with the corresponding sliding blocks.

In some embodiments, the angle pin fixing seat is fixed to the upper-layer case by rivets or screws.

In some embodiments, the angle pin return spring has a tapered shape, and a width of an end thereof connected to the angle pin is smaller than a width of an end thereof connected to the angle pin fixing seat, so as to prevent the spring from being stuck.

In some embodiments, the lower-layer case is provided with a gourd-shaped hole, and the stopping member passes through one end of the gourd-shaped hole, is mounted in the gourd-shaped hole, and can move in the gourd-shaped hole.

In another aspect, the present application provides a server including the server case latch structure according to any one of the above.

BRIEF DESCRIPTION OF THE DRAWINGS

In order to describe the embodiments of the present application or technical solutions in traditional technology more clearly, drawings required to be used in the embodiments or illustration of the traditional technology will be briefly introduced below. It would be obvious that the drawings in the illustration below are only some embodiments of the present application. Those ordinarily skilled in the art also can obtain other drawings according to the provided drawings without creative work.

DETAILED DESCRIPTION

The technical solutions in embodiments of the present application will be clearly and completely described below with reference to accompanying drawings in the embodiments of the present application. Obviously, the described embodiments are only a part of the embodiments of the present application, rather than all the embodiments. Based on the embodiments of the present application, all other embodiments obtained by those skilled in the art without creative work shall fall within protection scope of the present application.

In a first aspect of the present application, a server case latch structure is provided. The structure may be mounted without tools during use, thereby reducing complexity of use, and providing possibility of convenient use.

In another aspect of the present application, a server including the server case latch structure is provided.

Figure 1:
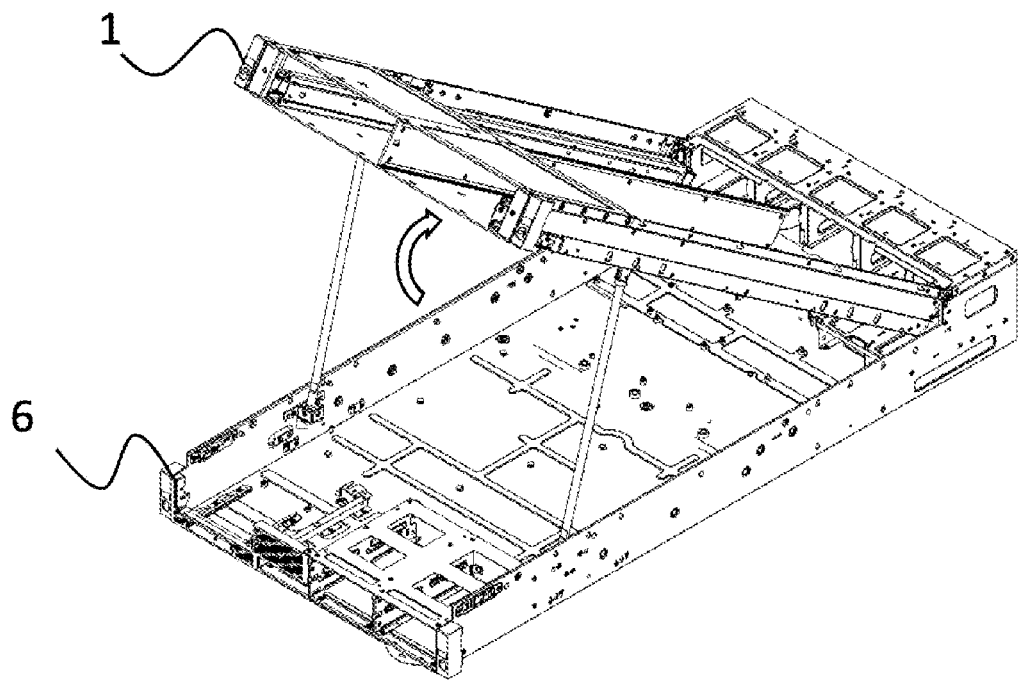
FIG. 1 is a schematic architectural diagram of an upper-layer and a lower-layer case according to one or more embodiments of the present application.
Figure 2:
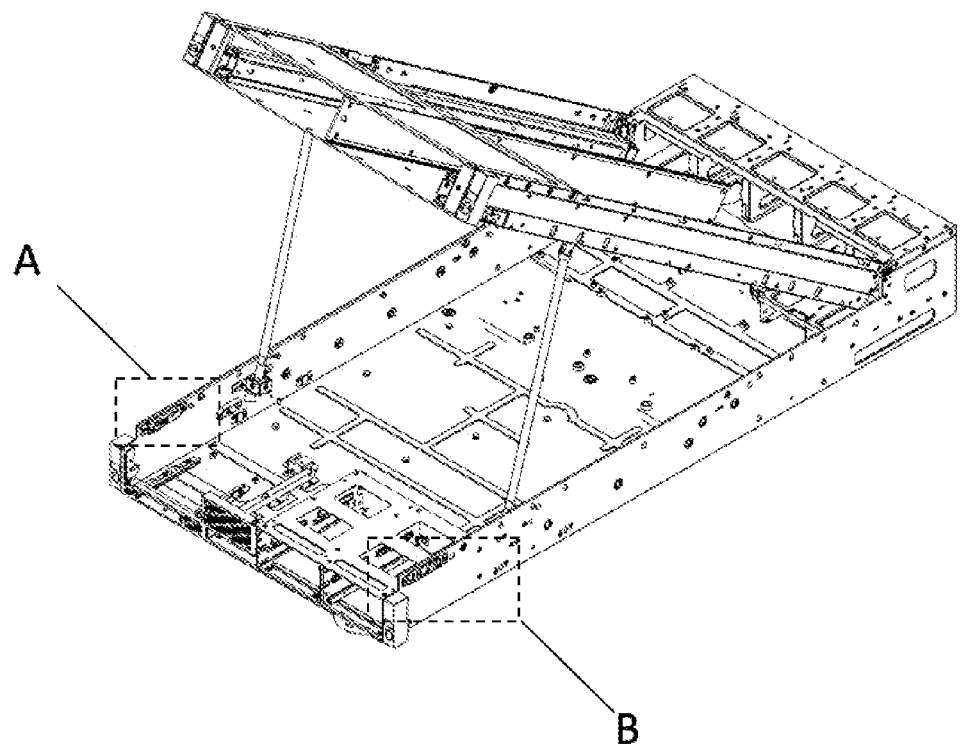
FIG. 2 is a diagram showing a rotation state of the upper-layer case according to one or more embodiments of the present application.
Figure 3:
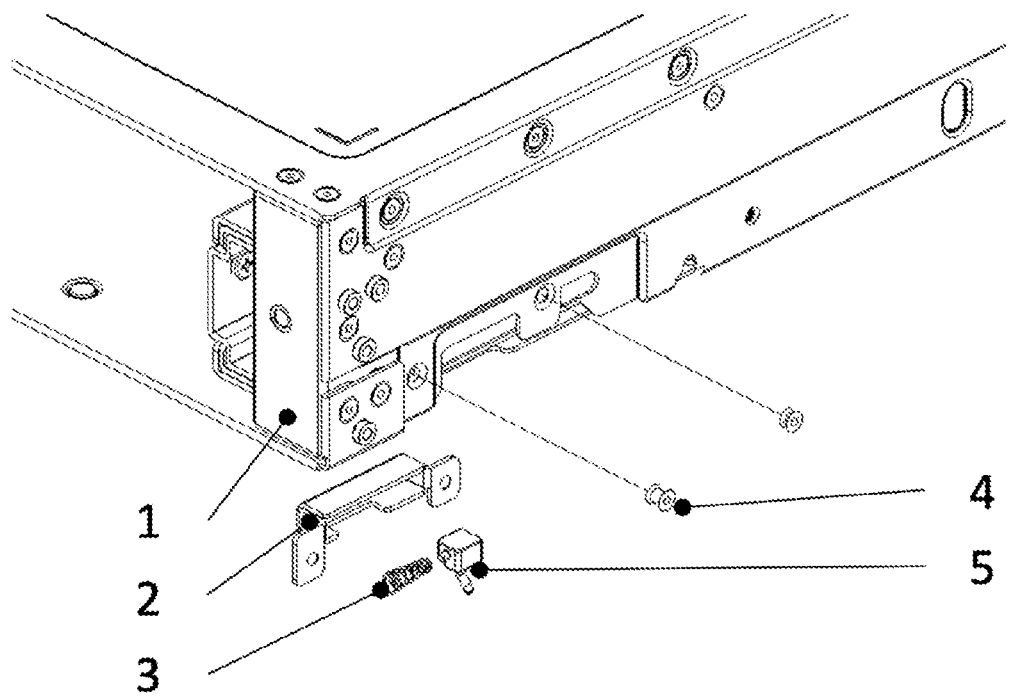
FIG. 3 is a partially exploded view of the upper-layer case according to one or more embodiments of the present application.
Figure 4:
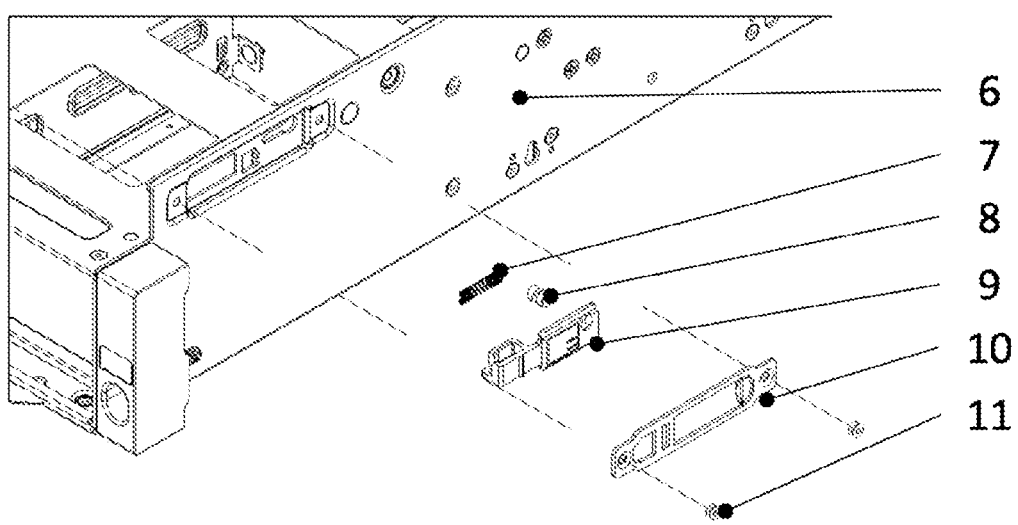
FIG. 4 is a partially exploded view of the lower-layer case according to one or more embodiments of the present application.
Figure 5:
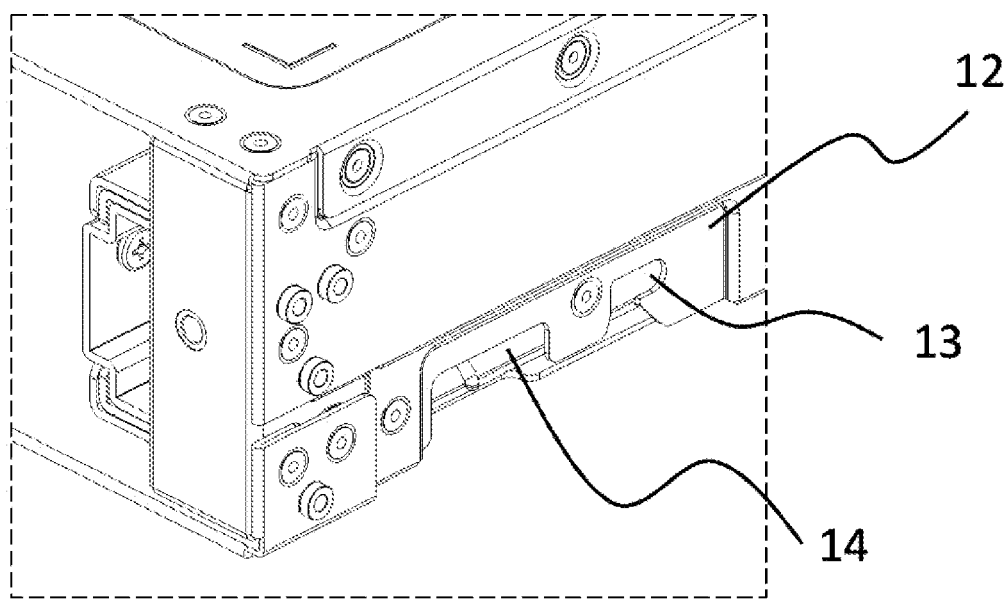
FIG. 5 is a partially assembled view of the upper-layer case according to one or more embodiments of the present application.
Figure 6:
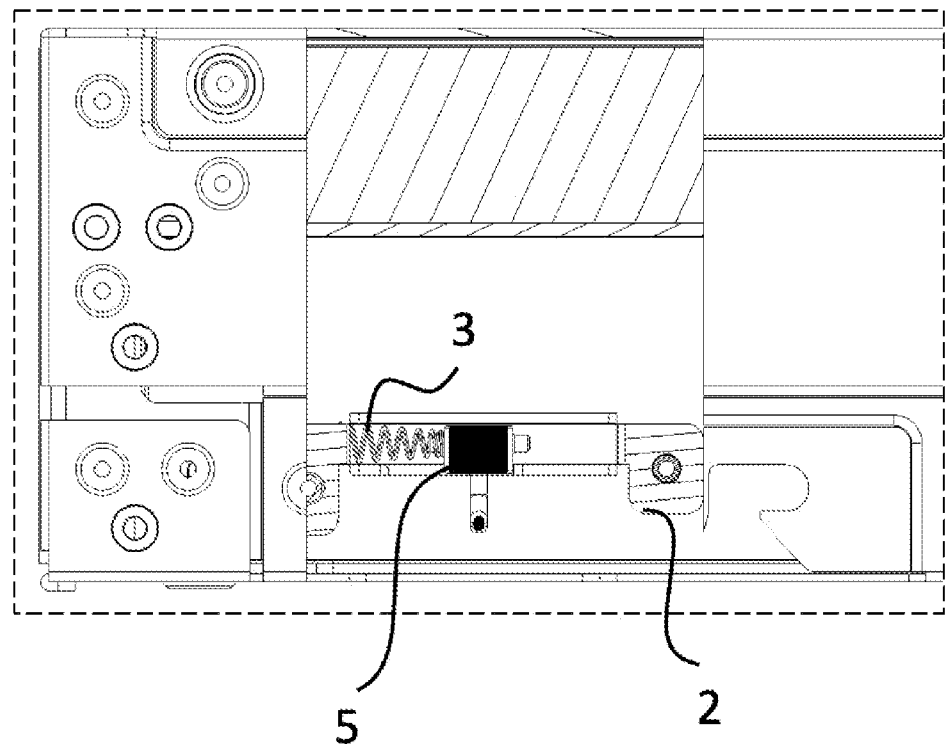
FIG. 6 is a right sectional view of the upper-layer case according to one or more embodiments of the present application.

Referring to FIG. 1 to FIG. 13, the server case latch structure includes an upper-layer case 1 and a lower-layer case 6. The upper-layer case and the lower-layer case can be buckled and can be disengaged. FIG. 1 and FIG. 2 show a flipped state and a closed state of the upper-layer case and the lower-layer case. The figures show that two inner spaces of the upper-layer case 1 are occupied by slide rails, and show tool-free maintenance structures on both sides of the lower-layer case 6.

An L-shaped groove 13 is formed on the upper-layer case 1, and the lower-layer case 6 is provided with a locking snapping portion 111 and an unlocking snapping portion 112.

Figure 7:
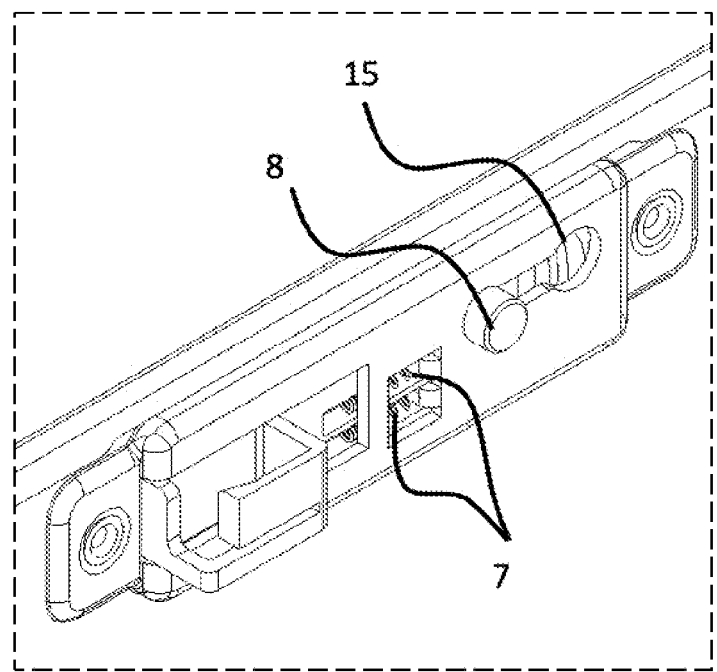
FIG. 7 is a partially enlarged view of an inner side of the lower-layer case at A in FIG. 2.
Figure 8:
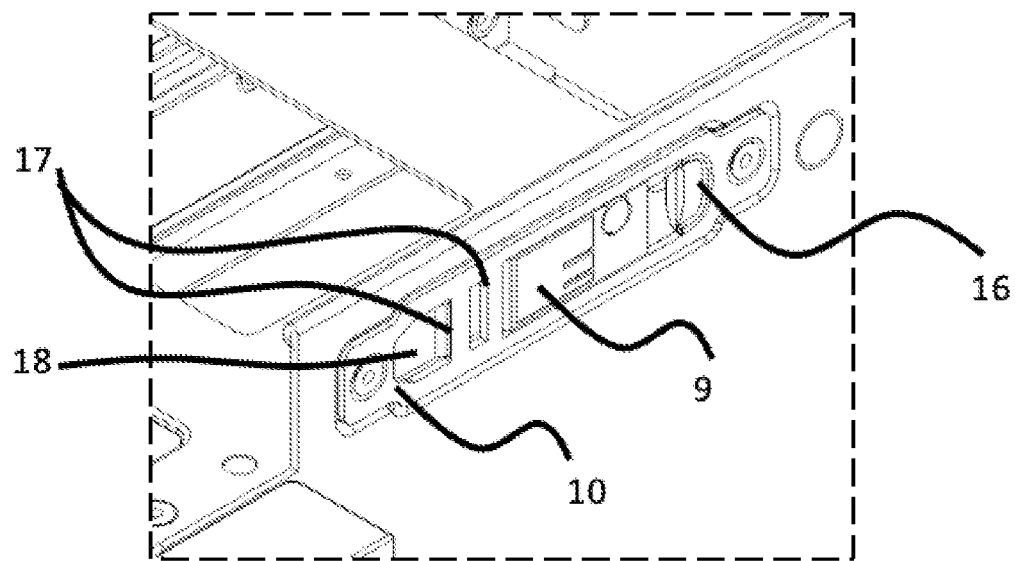
FIG. 8 is a partially enlarged view of an outer side of the lower-layer case at B in FIG. 2.

Please refer to FIG. 7 and FIG. 8. FIG. 7 is a schematic enlarged view at A in FIG. 2, and FIG. 8 is a schematic enlarged view at B in FIG. 2.

A sliding block 9 is slidably provided at an edge of the lower-layer case 6. The sliding block 9 is provided with an elastic arm 96 that is provided with a hook 94. The hook 94 can be snapped with the locking snapping portion 111 or the unlocking snapping portion 112 in a sliding stroke of the sliding block 9. The sliding block 9 is provided with an operation portion 97 capable of being manually shifted.

A stopping member is disposed on the sliding block 9 and configured to be snapped with the L-shaped groove 13 so as to limit disengagement of the upper-layer case 1 and the lower-layer case 6.

When the sliding block 9 moves to snap the hook 94 with the locking snapping portion 111, the stopping member is snapped with the L-shaped groove 13, whereby the upper-layer case 1 and the lower-layer case 6 are locked. When the sliding block 9 moves to a position where the hook 94 is disengaged from the locking snapping portion 111, the stopping member and the L-shaped groove 13 are disengaged and unlocked, and the upper-layer case 1 and the lower-layer case 6 are unlocked.

In some embodiments, the upper-layer case 1 may be provided with an upper-layer base protrusion 12, namely a structure recessed inwardly relative to the upper-layer case 1, so as to avoid a position of a structural member of the lower-layer case 6. The L-shaped groove 13 may be formed on the upper-layer base protrusion 12 or at other locations of the upper-layer case 1.

The L-shaped groove 13 is configured to fit with the position of the stopping member, so as to fix the case. After the upper-layer case 1 is flipped down or mounted down vertically, an operator can manually shift the elastic arm 96 of the sliding block 9, whereby the sliding block 9 slides to a locking position. Then, when unlocking is needed, the sliding block 9 may be manually shifted to disengage the hook 94 from the locking snapping portion 111. At this moment, the corresponding stopping member is at a position where the stopping member is unlocked from the L-shaped groove 13, and the upper-layer case 1 may be manually flipped or disassembled. The structure may be manually moved by shifting the sliding block 9 and removing the hook 94 of the sliding block 9.

In the present application, when the sliding block 9 slides to the locking position during the sliding process, the hook 94 may snap the locking snapping portion 111 to snap the upper-layer case 1. When sliding to the unlocking position, the hook 94 may snap the unlocking snapping portion 112 to unlock with the upper-layer case 1.

According to the server case latch structure provided by the present application, a locked state and an unlocked state can be changed by using the sliding block 9 and the stopping member disposed on the upper-layer case 1 and the lower-layer case 6. It is necessary to manually control the position of the sliding block 9 during the operation process, whereby the locking and unlocking of the case can be controlled simply and conveniently, and the locked state is stable.

In some embodiments, the lower-layer case 6 is provided with a sliding block return spring 7 connected to the sliding block 9. An elastic force of the sliding block return spring 7 is configured to locate the sliding block 9 at a snap position of the locking snapping portion 111 with the hook 94. That is, the elastic force of return is provide for the return of the sliding block 9. The sliding block 9 is provided with the sliding block return spring 7. Therefore, the sliding block 9 may be automatically returned after the sliding block 9 is manually unlocked.

In some embodiments, the sliding block 9 is provided with a return spring mounting groove 92. The sliding block return spring 7 is provided in the return spring mounting groove 92.

On a basis of above-mentioned embodiments, a sliding block cover plate 10 is further included. The sliding block cover plate is provided on the lower-layer case 6 and forms a sliding rail of the sliding block 9 with the lower-layer case 6. Both the locking snapping portion 111 and the unlocking snapping portion 112 are provided on the sliding block cover plate 10. The sliding block cover plate 10 is provided with a hand pushing via hole 18, whereby the hand of an operator stretches into the hand pushing via hole 18 from the outside of the lower-layer case 6 and pushes up the operation portion 97, and the hook 94 moves from the unlocking snapping portion 112 to the locking snapping portion 111.

The sliding block cover plate 10 may be fixed to the lower-layer case 6 by a structure such as a rivet or a screw, whereby the sliding block cover plate 10 and the lower-layer case 6 form an inner cavity in which the sliding block 9 slides. The sliding block cover plate 10 is provided with the locking snapping portion 111 and the unlocking snapping portion 112 in snapping fit with the hook 94. Both the locking snapping portion 111 and the unlocking snapping portion 112 may have groove or notch 17 structures.

Figure 9:
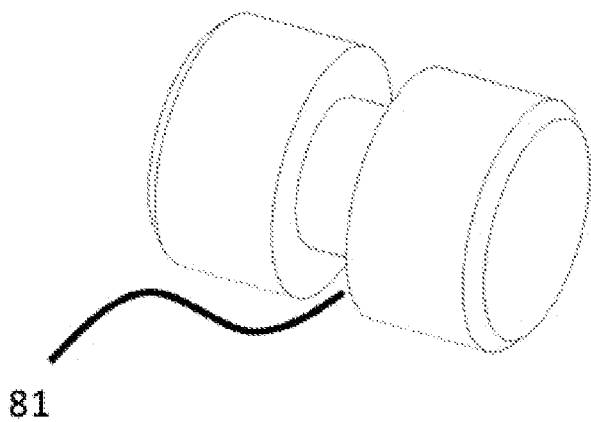
FIG. 9 is an axial view of an I-shaped stopping nail according to one or more embodiments of the present application.
Figure 10:
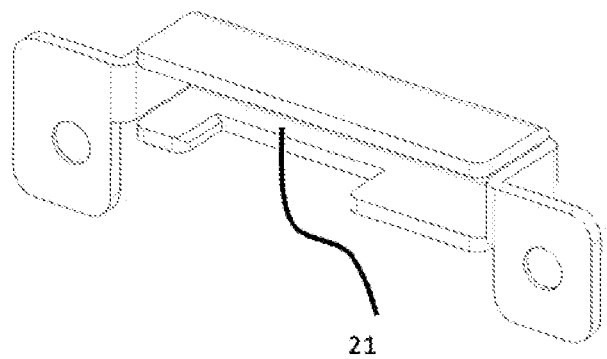
FIG. 10 is an axial view of an angle pin fixing seat according to one or more embodiments of the present application.
Figure 11:
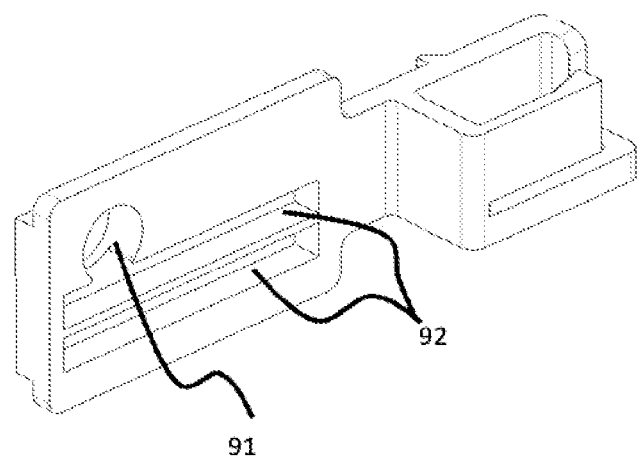
FIG. 11 is an axial view of another angle pin fixing seat according to one or more embodiments of the present application at another angle.
Figure 12:
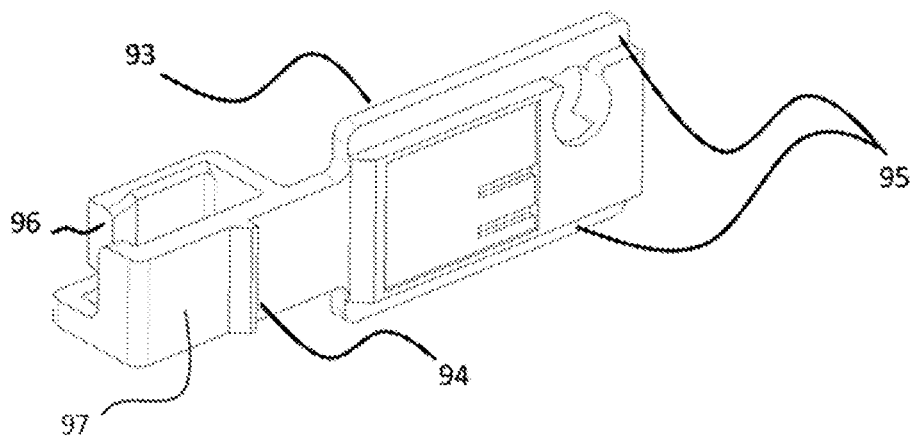
FIG. 12 is an axial view of a sliding block according to one or more embodiments of the present application.
Figure 13:
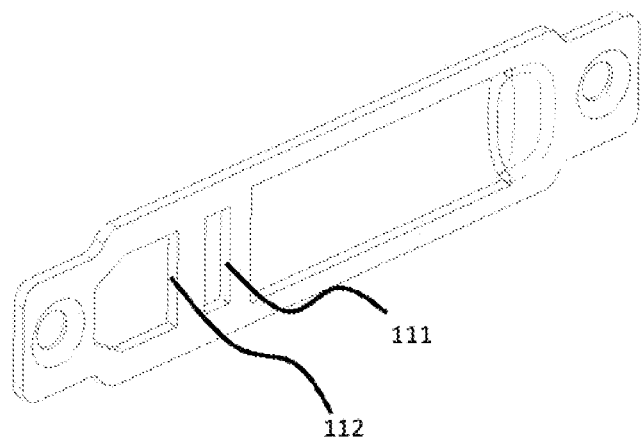
FIG. 13 is an axial view of a sliding block cover plate according to one or more embodiments of the present application.

Please refer to FIG. 9, the stopping member may be an I-shaped stopping nail 8, and a middle part of the I-shaped stopping nail 8 is provided with an annular snapping groove 81. The I-shaped stopping nail 8 is snapped and fixed to the sliding block 9. The annular snapping groove 81 is facilitate sliding in the L-shaped groove 13.

On the basis of the above-mentioned embodiments, the latch structure includes the hook 94 for manually unlocking the sliding block, and an automatic unlocking structure designed on the upper-layer case 1. When the upper-layer case 1 is assembled, the sliding block 9 may automatically slide from the unlocking position to the locking position.

The automatic unlocking structure includes an angle pin fixing seat 2 disposed on the upper-layer case 1 and an angle pin 5. The angle pin 5 is slidably disposed in a track of the angle pin fixing seat 2 and connected to the angle pin fixing seat 2 through an angle pin return spring 3. An elastic force of the angle pin return spring 3 is configured to move the angle pin 5 to a locking position. In order to prevent the angle pin 5 from being stuck, in some embodiments, the angle pin return spring 3 is tapered, and a structural member fitting with the angle pin 5 is chamfered.

When the angle pin 5 moves to the locking position, the angle pin 5 pushes the sliding block 9 to slide to the position where the hook 94 is snapped with the locking snapping portion 111, and the stopping member is snapped with the L-shaped groove 13.

When the sliding block 9 moves to the position where the hook 94 is disengaged from the locking snapping portion 111, the sliding block 9 pushes the angle pin 5, and the angle pin return spring 3 is forced and deformed.

In some embodiments, the angle pin fixing seat 2 is configured to hold the angle pin 5 and the angle pin return spring 3, and the angle pin 5 may slide back and forth in the inner cavity of the angle pin fixing seat 2.

In some embodiments, the angle pin 5 has two positions including an working position and a non-working position. The angle pin 5 is movable between the working position and the non-working position.

The working position is a normal position of the angle pin 5, that is, the locking position mentioned above. When the upper-layer case 1 is mounted, the angle pin 5 pulls the hook 94 of the sliding block from the unlocking position, and the hook 94 of the sliding block slides to the locking snapping portion 111.

When the upper-layer case is rotated or mounted down vertically, the position of the sliding block 9 may be unlocked in the moving route of the angle pin 5, whereby the sliding block 9 slides from the position where the hook 94 and the unlocking snapping portion 112 are snapped to the position where the hook 94 and the locking snapping portion 111 are snapped, thereby forming position locking of the stopping member.

With regard to the non-working position, when the upper-layer case 1 is unlocked by manual sliding, the angle pin 5 is pressed by a wedge-shaped end face of the sliding block 9. At this moment, the angle pin 5 is pushed up to the non-working position. After the upper-layer case 1 is completely disengaged, the angle pin 5 may return to the working position under the force of the angle pin return spring 3 for the next operation.

In some embodiments, the angle pin fixing seat 2 may be fixed to the upper-layer case 1 by rivets or screws.

In some embodiments, the angle pin return spring 3 provides an elastic force for the return of the angle pin 5. In some embodiments, the entire angle pin return spring 3 has a generally tapered shape, and the width of an end (for example, a first end) of the entire angle pin return spring 3 connected to the angle pin 5 is smaller than the width of an end (for example, a second end) of the entire angle pin return spring 3 connected to the angle pin fixing seat 2, so as to prevent the entire angle pin return spring 3 from being stuck. The angle pin fixing seat 2 is provided with an angle pin fixing chamber 21 for accommodating the angle pin 5.

In the use process of the above-mentioned structure, the sliding block 9 mounted on the side of the lower-layer case 6 may be pushed by the angle pin 5 of the upper-layer case 1 by rotating down or mounting the upper-layer case 1 down vertically, whereby the hook 94 of the sliding block 9 moves from the unlocking snapping portion 112 to the locking snapping portion 111, thereby realizing automatic locking operation. It may be known that since the sliding block 9 moves from the unlocking snapping portion 112 to the locking snapping portion 111, the hook 94 is first disengaged from the unlocking snapping portion 112 and then connected to the locking snapping portion 111. Therefore, compared with the working mode requiring manual unlocking and locking in the foregoing scheme, the scheme provided in this embodiment has fewer operation steps and is more convenient for operation.

It should be noted that the sliding block 9 is provided with a protruding structure for being in squeezing fit with the angle pin 5, the angle pin 5 is provided with a wedge-shaped surface, and the protruding structure is provided with a wedge-shaped end that fits with the wedge-shaped surface. And/or, the sliding block 9 is provided with a recessed hand clasp position 16, whereby the sliding block 9 is shifted.

It should be noted that the sliding block 9 may drive the I-shaped stopping nail 8 to move, the sliding block 9 is provided with the elastic arm 96, and the elastic arm 96 is provided with the hook 94. The sliding block 9 may slide back and forth in the inner cavity of the sliding block cover plate 10 and the lower-layer case 6. The sliding block 9 is provided with the protruding structure for locking and unlocking in fit with the angle pin 5. In actual operation, the elastic arm 96 may also be squeezed and unlocked by manually passing through the hand pushing via hole 18. The sliding block 9 is provided with an end face for pushing the angle pin 5. When the sliding block 9 is manually shifted to the unlocking position (where the hook 94 and the unlocking snapping portion 112 are snapped), the angle pin 5 may be pushed away to realize complete unlocking operation.

In some embodiments, both sides of the upper-layer case 1 are provided with the angle pin 5 and the angle pin fixing seat 2, and inner walls of both sides of the lower-layer case 6 are provided with corresponding sliding blocks 9.

In some embodiments, the number of the angle pins 5 and the angle pin fixing seats 2 is not specifically limited and may be adjusted according to the use requirements.

On the basis of any of the above-mentioned embodiments, the lower-layer case 6 is provided with a gourd-shaped hole 15, and the stopping member passes through one end of the gourd-shaped hole 15, is mounted in the gourd-shaped hole 15, and may move in the gourd-shaped hole 15.

The gourd-shaped hole 15 is configured to fix the stopping member. The stopping member is mounted on the gourd-shaped hole 15 of the lower-layer case 6 and may slide in the front and back direction. When the upper-layer case 1 is rotated or mounted vertically, the stopping member slides into the L-shaped groove 13, thus playing a role in fixing the upper-layer case 1 and the lower-layer case 6. It should be noted that a cylindrical surface of the stopping member may be connected in fit with the sliding block 9 and slide along with the sliding block 9.

The server case latch structure provided by the present application includes upper-layer and lower-layer case components. The upper-layer case components mainly include an upper-layer case 1, an angle pin fixing seat 2, an angle pin return spring 3, a rivet 4 or a screw, and an angle pin 5. The lower-layer case components mainly include a lower-layer case 6, a sliding block return spring 7, an I-shaped stopping nail 8, a sliding block 9, a sliding block cover plate 10, and a rivet or a screw 11.

In some embodiments, the angle pin return spring 3 is sleeved on the cylindrical outer side of the angle pin 5, and the angle pin 5 and the angle pin return spring 3 are mounted in an inner cavity of the angle pin fixing seat 2 and may slide back and forth. In some embodiments, the angle pin fixing seat 2 is fixed to the inner side of the upper-layer case 1 by the rivet 4 or the like, whereby the angle pin 5, the angle pin return spring 3 and the angle pin fixing seat 2 are integrated on the upper-layer case 1.

In some embodiments, the I-shaped stopping nail 8 is mounted on a gourd-shaped hole 15 of the lower-layer case 6, which may also be an elongated hole of another type.

In some embodiments, a stopping nail mounting hole 91 of the sliding block 9 is a circular hole or another hole for fixedly mounting the I-shaped stopping nail 8, whereby the I-shaped stopping nail 8 slides back and forth following the sliding block 9.

In some embodiments, side sliding surfaces 95 are provided on both sides of the sliding block 9 to fit with the sliding block cover plate 10, and bottom sliding surfaces 93 are provided on the upper and lower bottoms of the sliding block 9, whereby the sliding block 9 slides back and forth in the inner cavity formed by the cover plate 10 and the lower-layer case 6.

In a process of snap-fit and locking, firstly, the upper-layer case 1 is rotated down or mounted vertically, and the elastic arm 96 of the sliding block 9 is manually pushed or the hook 94 of the sliding block 9 is unlocked directly through the movement of the angle pin 5 of the upper-layer case 1, so as to achieve the function of automatic locking. The movement of the sliding block 9 may drive the stopping member to slide to a position where the stopping member and the L-shaped groove 13 are snapped, thus forming the snap-fit and locking of the upper-layer case and the lower-layer case.

When unlocking is needed, the sliding block 9 is manually slid, whereby the sliding block 9 drives the stopping member to slide to the unlocking position, the movement direction of the sliding block 9 squeezes the angle pin 5, the angle pin 5 is pushed to the non-working position through the sliding end face, and the sliding block 9 is at the unlocking position. At this moment, the upper-layer case 1 is rotated up, and the angle pin 5 returns to the working position under the action of the angle pin return spring 3, so as to return to the initial position of an open state.

When the upper-layer case 1 is rotated down again, the angle pin 5 at the working position may unlock the sliding block 9 and the stopping member, and the sliding block 9 may drive the stopping member to be unlocked. Under force of the sliding block return spring 7, the sliding block 9 slides to the locking position, and the hook 94 and the locking snapping portion 111 are snapped and keep in a stable state.

The above-mentioned operation process is a tool-free operation process, which includes manually pushing the sliding block 9 and automatically unlocking the sliding block 9 by using the angle pin 5 mounted on the upper-layer case 1.

In addition to the server case latch structure provided in the above-mentioned embodiments, the present application also provides a server including the server case latch structure disclosed in the above-mentioned embodiments. For the structures of other parts of the server, reference is made to the prior art. Details are not described again herein.

Various embodiments are described in this specification in a progressive manner. Each embodiment focuses on differences from the other embodiments. The same or similar parts of the various embodiments may be referred to each other.

The server case latch structure and the server provided by the present application have been introduced above in detail. The principles and implementations of the present application have been set forth herein using examples. The above embodiments have been set forth only to aid in the understanding of the method and core ideas of the present application. It should be noted that those of ordinary skill in the art may make numerous improvements and modifications to the present application without departing from the principles of the present application. Such improvements and modifications are intended to be within the scope of protection of the appended claims of the present application.

REFERENCE NUMERALS

1: Upper-layer case
2: Angle pin fixing seat
3: Angle pin return spring
4: Rivet
5: Angle pin
6: Lower-layer case
7: Sliding block return spring
8: I-shaped stopping nail
9: Sliding block
10: Sliding block cover plate
11: Screw
12: Upper-layer base protrusion
13: L-shaped groove
14: Sliding block avoidance notch
15: Gourd-shaped hole
16: Hand clasp position
17: Notch
18: Hand pushing via hole
21: Angle pin fixing chamber
81: Snapping groove
91: Stopping nail mounting hole
92: Return spring mounting groove
93: Bottom sliding surface
94: Hook
95: Side sliding surface
96: Elastic arm
97: Operation portion
111: Locking snapping portion
112: Unlocking snapping portion

The invention claimed is:

1. A server case latch structure, comprising:
an upper-layer case and a lower-layer case, wherein the upper-layer case and the lower-layer case can be buckled and can be disengaged, an L-shaped groove is formed on the upper-layer case, and the lower-layer case is provided with a locking snapping portion and an unlocking snapping portion;
a sliding block, slidably provided at an edge of the lower-layer case, wherein the sliding block comprises an elastic arm that is provided with a hook, the hook can be snapped with the locking snapping portion or the unlocking snapping portion in a sliding stroke of the sliding block, and the sliding block comprises an operation portion capable of being manually shifted; and
a stopping member, disposed on the sliding block and configured to be snapped with the L-shaped groove so as to limit disengagement of the upper-layer case and the lower-layer case, wherein
when the sliding block moves to snap the hook with the locking snapping portion, the stopping member is snapped with the L-shaped groove, whereby the upper-layer case and the lower-layer case are locked; and
when the sliding block moves to disengage the hook from the locking snapping portion and snap with the unlocking snapping portion, the stopping member is un-snap locked from the L-shaped groove, and the upper-layer case and the lower-layer case are unlocked.

2. The server case latch structure according to claim 1, wherein the upper-layer case is provided with an upper-layer base protrusion which is recessed relative to the upper-layer case.

3. The server case latch structure according to claim 2, wherein the L-shaped groove is formed on the upper-layer base protrusion.

4. The server case latch structure according to claim 1, wherein the lower-layer case is provided with a sliding block return spring connected to the sliding block, and an elastic force of the sliding block return spring is configured to locate the sliding block at a snap position of the locking snapping portion with the hook.

5. The server case latch structure according to claim 1, further comprising a sliding block cover plate which is disposed on the lower-layer case and forms a sliding rail of the sliding block with the lower-layer case, wherein
the sliding block cover plate is provided with a hand pushing via hole, whereby the hand pushing via hole is configured such that a hand of an operator stretches into the hand pushing via hole from outside of the lower-layer case and pushes up the operation portion, and the hook moves from the unlocking snapping portion to the locking snapping portion.

6. The server case latch structure according to claim 5, wherein the sliding block cover plate is fixed to the lower-layer case by rivets or screws, whereby the sliding block cover plate and the lower-layer case form an inner cavity in which the sliding block slides.

7. The server case latch structure according to claim 5, wherein the locking snapping portion and the unlocking snapping portion are disposed on the sliding block cover plate.

8. The server case latch structure according to claim 7, wherein the locking snapping portion and the unlocking snapping portion have groove or notch structures.

9. The server case latch structure according to claim 1, wherein the stopping member is an I-shaped stopping nail, and a middle part of the I-shaped stopping nail is provided with an annular snapping groove.

10. The server case latch structure according to claim 9, wherein the I-shaped stopping nail is snapped and fixed to the sliding block, and the annular snapping groove facilitates the sliding blocking sliding in the L-shaped groove.

11. The server case latch structure according to claim 4, wherein the sliding block is provided with a return spring mounting groove, and the sliding block return spring is provided in the return spring mounting groove.

12. The server case latch structure according to claim 1, further comprising:
an angle pin return spring;
an angle pin fixing seat, disposed on the upper-layer case; and
an angle pin, slidably disposed in a track of the angle pin fixing seat and connected to the angle pin fixing seat through the angle pin return spring, an elastic force of the angle pin return spring is configured to move the angle pin to a locking position, wherein
under a condition that the angle pin moves to the locking position, the angle pin pushes the sliding block to slide to a position where the hook is snapped with the locking snapping portion, and the stopping member is snapped with the L-shaped groove; and
under a condition that the sliding block moves to a position where the hook is disengaged from the locking snapping portion, the sliding block pushes the angle pin, and the angle pin return spring is forced and deformed.

13. The server case latch structure according to claim 12, wherein the sliding block is provided with a protruding structure configured to be in squeezing fit with the angle pin, the angle pin is provided with a wedge-shaped surface, and the protruding structure is provided with a wedge-shaped end that fits with the wedge-shaped surface.

14. The server case latch structure according to claim 13, wherein the sliding block is further provided with a recessed hand clasp position, whereby the sliding block is shifted.

15. The server case latch structure according to claim 12, wherein the angle pin fixing seat is provided with an angle pin fixing chamber for accommodating the angle pin.

16. The server case latch structure according to claim 12, wherein both sides of the upper-layer case are provided with the angle pin and the angle pin fixing seat, an inner wall of a first side of the lower-layer case is provided with the sliding block and an inner wall of a second side of the lower-layer case is provided with a second sliding block.

17. The server case latch structure according to claim 12, wherein the lower-layer case is provided with a gourd-shaped hole, and the stopping member passes through one end of the gourd-shaped hole, is mounted in the gourd-shaped hole, and is configured to move in the gourd-shaped hole.

18. The server case latch structure according to claim 12, wherein the angle pin fixing seat is fixed to the upper-layer case by rivets or screws.

19. The server case latch structure according to claim 12, wherein the angle pin return spring has a tapered shape, and a width of a first end of the angle pin return spring connected to the angle pin is smaller than a width of a second end of the angle pin return spring connected to the angle pin fixing seat, so as to prevent the angle pin return spring from being stuck.

20. A server, comprising a server case latch structure, wherein the server case latch structure comprises:
- an upper-layer case and a lower-layer case, wherein the upper-layer case and the lower-layer case can be buckled and can be disengaged, an L-shaped groove is formed on the upper-layer case, and the lower-layer case is provided with a locking snapping portion and an unlocking snapping portion;
- a sliding block, slidably provided at an edge of the lower-layer case, wherein the sliding block comprises an elastic arm that is provided with a hook, the hook can be snapped with the locking snapping portion or the unlocking snapping portion in a sliding stroke of the sliding block, and the sliding block comprises an operation portion capable of being manually shifted; and
- a stopping member, disposed on the sliding block and configured to be snapped with the L-shaped groove so as to limit disengagement of the upper-layer case and the lower-layer case, wherein when the sliding block moves to snap the hook with the locking snapping portion, the stopping member is snapped with the L-shaped groove, whereby the upper-layer case and the lower-layer case are locked; and when the sliding block moves to disengage the hook from the locking snapping portion and snap with the unlocking snapping portion, the stopping member is un-snap locked from the L-shaped groove, and the upper-layer case and the lower-layer case are unlocked.

* * * * *